United States Patent
Powell et al.

(10) Patent No.: US 8,382,901 B2
(45) Date of Patent: *Feb. 26, 2013

(54) SYSTEM AND METHOD FOR DEPOSITING A MATERIAL ON A SUBSTRATE

(75) Inventors: Ricky Charles Powell, Ann Arbor, MI (US); Andrew Kelly Gray, Perrysburg, OH (US); Todd Alden Coleman, Wayne, OH (US)

(73) Assignee: First Solar, Inc., Perrysburg, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/153,183

(22) Filed: Jun. 3, 2011

(65) Prior Publication Data

US 2011/0232570 A1 Sep. 29, 2011

Related U.S. Application Data

(62) Division of application No. 11/380,073, filed on Apr. 25, 2006, now Pat. No. 7,968,145.

(60) Provisional application No. 60/675,078, filed on Apr. 26, 2005.

(51) Int. Cl.
*C23C 16/448* (2006.01)
*C23C 16/455* (2006.01)

(52) U.S. Cl. .............. 118/719; 118/726; 427/248.1

(58) Field of Classification Search .................. None
See application file for complete search history.

(56) References Cited

U.S. PATENT DOCUMENTS

| | | |
|---|---|---|
| 3,858,548 A | 1/1975 | Tick |
| 3,954,423 A | 5/1976 | Hamper et al. |
| 3,966,127 A | 6/1976 | Pytlewski |
| 4,512,868 A | 4/1985 | Fujimura et al. |
| 4,606,776 A | 8/1986 | Salis |
| 4,987,284 A | 1/1991 | Fujimura et al. |
| 5,174,983 A | 12/1992 | Snail |
| 5,248,349 A | 9/1993 | Foote et al. |
| 5,445,973 A | 8/1995 | Hedström |
| 5,837,320 A | 11/1998 | Hampden-Smith et al. |
| 5,994,642 A | 11/1999 | Higuchi et al. |
| 6,037,241 A | 3/2000 | Powell et al. |
| 6,432,203 B1 | 8/2002 | Black et al. |
| 6,444,043 B1 | 9/2002 | Gegenwart et al. |
| 6,660,328 B1 | 12/2003 | Dahmen et al. |
| 7,910,166 B2 | 3/2011 | Powell et al. |
| 7,927,659 B2 | 4/2011 | Powell et al. |
| 7,931,937 B2 | 4/2011 | Powell et al. |
| 2001/0011524 A1 | 8/2001 | Witzman et al. |
| 2002/0106461 A1 | 8/2002 | Talton |
| 2002/0129769 A1 | 9/2002 | Kim et al. |
| 2003/0168013 A1* | 9/2003 | Freeman et al. ............ 118/726 |
| 2004/0031442 A1 | 2/2004 | Yamazaki et al. |

OTHER PUBLICATIONS

International Search Report and Written Opinion dated Oct. 5, 2006, issued in corresponding International Application App. No. PCT/US06/15645.
Salis, U.S. Patent 4,606,776, Derwent Abstract Aug. 1996.

* cited by examiner

*Primary Examiner* — Joseph Miller, Jr.
(74) *Attorney, Agent, or Firm* — Dickstein Shapiro LLP

(57) ABSTRACT

A method and apparatus for depositing a film on a substrate includes introducing a material and a carrier gas into a heated chamber. The material may be a semiconductor material, such as a cadmium chalcogenide. A resulting mixture of vapor and carrier gas containing no unvaporized material is provided. The mixture of vapor and carrier gas are remixed to achieve a uniform vapor/carrier gas composition, which is directed toward a surface of a substrate, such as a glass substrate, where the vapor is deposited as a uniform film.

23 Claims, 19 Drawing Sheets

US 8,382,901 B2

SYSTEM AND METHOD FOR DEPOSITING A MATERIAL ON A SUBSTRATE

CLAIM OF PRIORITY

This application is a divisional application of U.S. application Ser. No. 11/380,073, filed Apr. 25, 2006 now U.S. Pat. No. 7,968,145, which claims priority under 35 U.S.C. §119 (e) to U.S. Provisional Patent Application Ser. No. 60/675,078 filed Apr. 26, 2005, the entire contents of both of which are hereby incorporated by reference.

TECHNICAL FIELD

The present invention relates to photovoltaic device production.

BACKGROUND

In the manufacture of a photovoltaic device, semiconductor material is deposited on a glass substrate. This may be accomplished by vaporizing the semiconductor and directing the vaporized semiconductor towards the glass substrate surface, such that the vaporized semiconductor condenses and is deposited on the glass, forming a solid semiconductor film.

SUMMARY

In general, a method and system for depositing a semiconductor material on a substrate includes introducing a material and a carrier gas into a distributor assembly having a heated first chamber to form a vapor of the material. The material can be a powder, for example, a powder of a semiconductor material. The carrier gas and vapor are then directed through a series of successive heated chambers to form a uniform vapor/carrier gas composition. The uniformity of the gas composition can be provided by flow and diffusion of the vapor and gas incident to passing the vapor and gas through a plurality of chambers of the distributor assembly. After the composition has become uniform, it is directed out the distributor assembly and towards a substrate, causing a film to be formed on a surface of substrate. The substrate can be a glass substrate or another suitable substrate such as polymer substrate having a surface suitable for forming a uniform film. The film can be a semiconductor composition. The vapor and carrier gas composition may be passed through a filter after being introduced into the distributor assembly in order to ensure that solid particles of that material are not directed toward the substrate. Advantageously, the method and system for depositing a semiconductor material provides a semiconductor film with improved film thickness uniformity and grain structure uniformity.

In one aspect, a method for depositing a film on a substrate includes directing a powder such as cadmium sulfide or cadmium telluride and an inert carrier gas such as helium through a feed tube into a heated distributor assembly including a network of sequentially connected chambers. The distributor assembly may include a plurality of successively shrouded tubes such that the semiconductor powder and inert gas are introduced through a feed tube into a first heated tube the interior of which is passably connected to the interior of a second chamber. The first heated tube is heated such that the semiconductor powder forms a vapor. The vapor and carrier gas are then directed from the first heated tube to the second chamber, which may itself be a heated tube, and which may be a heated tube larger than the first heated tube and provided such that the first heated tube is disposed within the second tube.

Movement of the vapor and carrier gas through passages between successive chambers of the distributor assembly and movement within the chambers themselves can create a flow which results in a uniform mixing of vaporized semiconductor and inert carrier gas. Additionally, passing the vapor and carrier gas through multiple heated chambers can require the vapor to travel a greater distance to the substrate and can allow more time for the powder to completely vaporize. The method may also include passing the vapor through a filter or other barrier permeable to vapor but not to powder to ensure that no powder is deposited on a surface of the substrate. Reducing or substantially eliminating the amount of powder from the vapor/carrier gas composition and providing a uniform vapor/carrier gas composition results in a deposited film that is substantially uniform as to both thickness and grain structure, resulting in higher-quality and lower-cost production.

In another aspect, a system for depositing a material on a substrate includes a heated distributor assembly having a plurality of sequentially connected chambers into which a powder and a carrier gas are introduced. The system includes a feed tube through which the powder and carrier gas are introduced into the first chamber of the distributor assembly. The distributor assembly may be heated by applying a current across one or more chambers included in the distributor assembly, or by another means that will heat at least a portion of the distributor assembly to a temperature sufficient to form a vapor from the powder. A heating element may be provided in the first chamber. One or more chambers in the distributor assembly may be heated in order to heat at least a portion of the distributor assembly. The system may also include a filter or other barrier permeable to vapor but not powder to substantially prevent powder from exiting the distributor assembly and being deposited on a surface of a substrate. The filter may be positioned within the first chamber.

The chambers in the distributor assembly are provided such that the vapor and carrier gas travel within each chamber and from each chamber to a successive chamber. A second chamber is provided proximate to the first chamber where the powder and carrier gas is introduced to the distributor assembly. After the powder is vaporized in the first chamber, it is directed into the proximate second chamber. The chambers included in the distributor assembly may be provided as a plurality of successively shrouded tubes such that the vapor and carrier gas are introduced into a first chamber which is a tube disposed within (e.g., shrouded by) another tube. The shrouded tube includes one or more apertures through which the vapor and carrier gas are directed from the shrouded tube to the shroud tube.

The distributor assembly may also include non-tubular chambers used in connection with tubular chambers or other non-tubular chambers. Additionally, the distributor assembly may be designed such that the vapor and carrier gas are directed from one chamber to the next through a passageway and not necessarily immediately through an aperture in a shrouded chamber into the interior of a shrouding chamber. Regardless of the specific configuration of the distributor assembly, the distributor assembly can provide a flow pattern for the vapor and carrier gas such that a uniform vapor/carrier gas composition is obtained as the vapor and carrier gas are directed within each chamber and between the chambers included in the distributor assembly. An outlet can be provided at the end of the distributor assembly and is positioned such that the uniform vapor/carrier gas composition directed through the distributor assembly and outlet is directed toward a surface of a substrate upon which the semiconductor is deposited as a film on a surface of the substrate. The outlet may be positioned proximate to the second chamber. Where the last chamber through which the vapor/carrier gas composition can be directed can be a tube, the outlet may be a slot oriented along the length of the tube. The outlet may also include a manifold having a plurality of orifices through which the vapor and carrier gas are directed toward the substrate.

The substrate upon which the film is deposited can be introduced in the proximity of the distributor assembly outlet by a conveyor system. The conveyor system may include a gas hearth for supporting and transporting a plurality of substrates past the distributor assembly outlet for deposition.

The method and system described here have the advantage over known systems and methods of depositing a semiconductor film on a substrate of providing a film of uniform thickness and grain structure. These properties can be important, particularly with respect to the use of semiconductor films in solar panels. The method and system described here also provide improved definition of the film deposition area, resulting in higher material utilization. As a result, the method and system described result in higher efficiency in the production of solar panels than is provided with known methods and systems.

The method can provide a material film having a uniform thickness and composition. A solid introduced into the system can be maintained at a temperature sufficient to vaporize the material for a duration of time sufficient to ensure that substantially all the material that is passed through the system forms a vapor. Additionally, a solid to be vaporized and a carrier gas introduced into the system are passed through the system in such a manner that the vapor and the carrier gas mix to form and maintain a uniform composition; segregation between the vapor and the carrier gas which can occur when passing through a permeable structure such as a filter on account of the difference in molecular weight between the vapor and carrier gas is substantially reduced.

The details of one or more embodiments are set forth in the accompanying drawings and the description below. Other features, objects, and advantages will be apparent from the description and drawings, and from the claims.

DETAILED DESCRIPTION

An apparatus and method for depositing a semiconductor film on a glass substrate are described, for example, in U.S. Pat. No. 6,037,241, the disclosure of which is herein incorporated by reference in its entirety.

A solid material such as a semiconductor powder and carrier gas can be introduced into a heated permeable tubular chamber, where the solid material is vaporized. The vapor and carrier gas then pass through the walls of the heated permeable chamber into a shroud surrounding the chamber. The shroud can include an opening through which the vapor is directed toward a surface of a substrate, such as a glass substrate, where it is deposited as a film.

Figure 1:
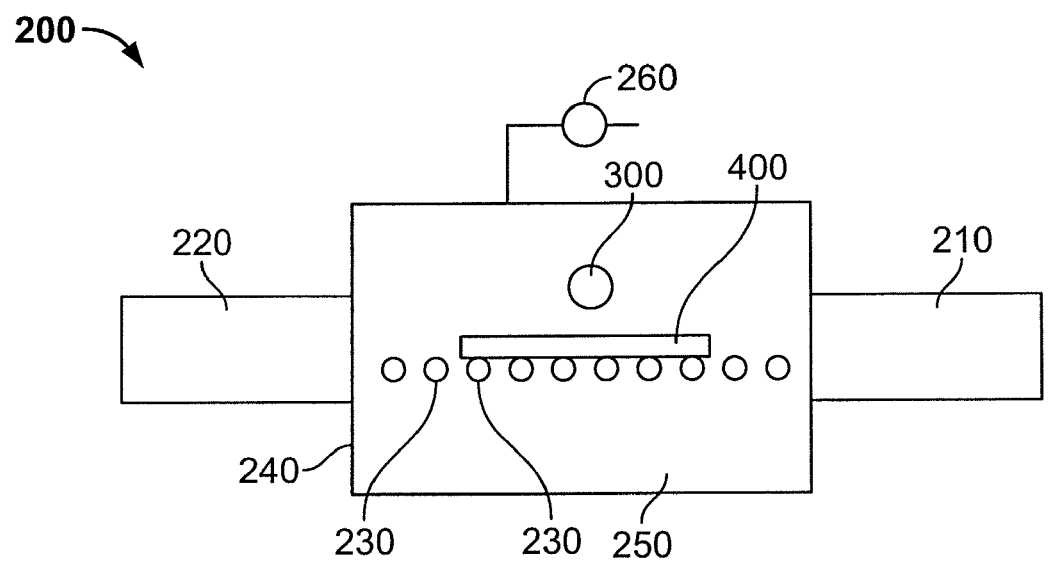
FIG. 1 is a drawing depicting a system for depositing a semiconductor on a glass sheet substrate.

With reference to FIG. 1 of the drawings, a substrate processing system 200 includes distributor assembly 300. Both the distributor assembly 300 and the method for processing a substrate 400 are described and exemplified here.

With continuing reference to FIG. 1, the system 200 includes a housing 240 defining a processing chamber 250 in which a material is deposited on a substrate 400. Substrate 400 can be a glass sheet. Housing 240 includes an entry station 210 and an exit station 220. Entry station 210 and exit station 220 can be constructed as load locks or as slit seals through which substrate 400 enters and exits the processing chamber 250. The housing 240 can be heated in any suitable manner such that its processing chamber can be maintained at a deposition temperature. The distributor temperature can be about 500 degrees to about 1200 degrees C. Substrate 400 can be heated during the processing to a substrate temperature. The substrate temperature can be 200 degrees to 650 degree C. Substrate 400 can be transported by any appropriate means such as rollers 230, or a conveyor belt, preferably driven by an attached electric motor.

Figure 2:
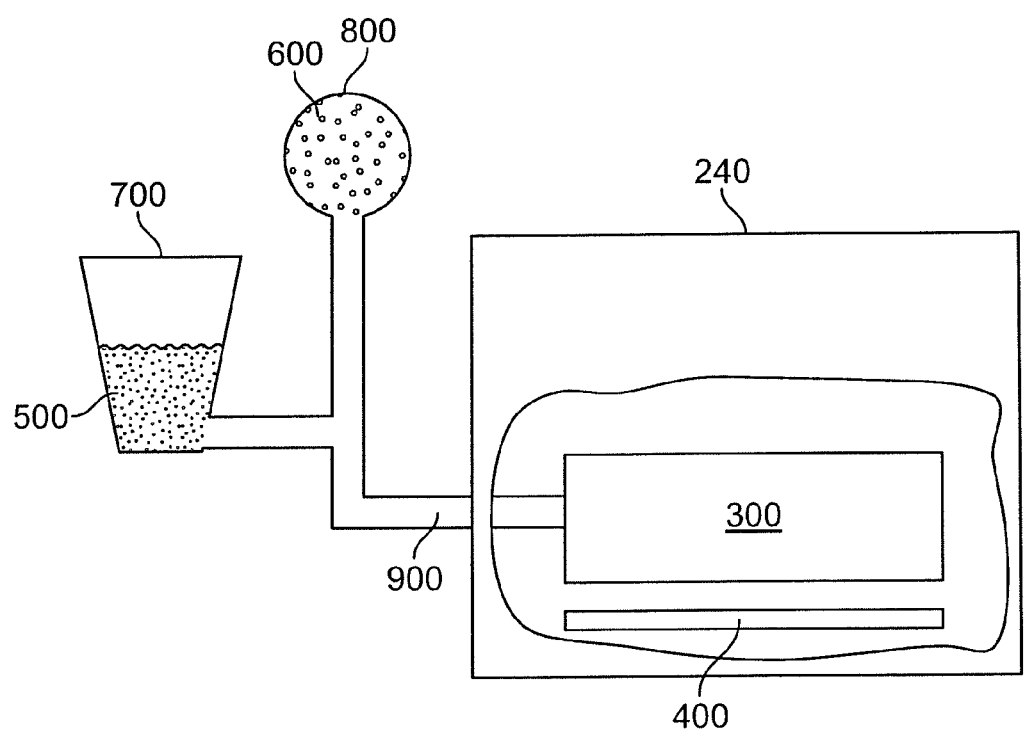
FIG. 2 is a drawing depicting a material supply for introducing a semiconductor powder and a carrier gas into a distributor assembly.

With reference to FIG. 2, distributor assembly 300 contained in housing 240 is connected by feed tube 900 to a material supply, which can include a hopper 700 containing a powder 500 and a carrier gas source 800 containing an appropriate carrier gas 600. Powder 500 can contact carrier gas 600 in feed tube 900, and both carrier gas 600 and powder 500 are introduced into distributor assembly 300.

After carrier gas 600 and powder 500 are introduced into distributor assembly 300, powder 500 is vaporized and directed through distributor assembly 300 along with carrier gas 600 in such a manner that carrier gas 600 and the vapor are mixed to form a uniform vapor/carrier gas composition. The uniform vapor/carrier gas composition is then directed out of distributor assembly 300 toward substrate 400. The lower temperature of substrate 400 compared to the temperature in distributor assembly 300 in order to maintain the material in vapor phase, causes condensation of the vapor on a surface of substrate 400, and the deposition of a film, which has a substantially uniform thickness and a substantially uniform structure demonstrating a uniform crystallization and a substantial absence of particulate material, such as unvaporized powder.

The exit point of the semiconductor vapor from distributor assembly 300 can be spaced from substrate 400 at a distance in the range of about 0.5 to about 5.0 cm to provide more efficient deposition. While greater spacing can be utilized, that may require lower system pressures and would result in material waste due to overspraying. Furthermore, smaller spacing could cause problems due to thermal warpage of substrate 400 during conveyance in the proximity of the higher temperature distributor assembly 300. Substrate 400 can pass proximate to the point where the semiconductor vapor exists distributor assembly 300 at a speed of at least about 20 mm per second to about 40 mm per second.

In performing the deposition, successful results have been achieved using cadmium telluride and cadmium sulfide as the material. However, it should be appreciated that other materials can be utilized which include a transition metal (Group IIB) and a chalcogenide (Group VIA). It should be further appreciated that additional materials that can be utilized to form a semiconductor film have many useful applications (such as the manufacture of photovoltaic devices) and may be used with the systems and methods described herein. Also, dopants may be useful to enhance the deposition and properties of the resulting film.

Use of system 200 to perform the method has been performed with a vacuum drawn in the processing chamber 250 to about 0.5 to 760 Torr. In that connection, as illustrated in FIG. 1, the processing system 200 includes a suitable exhaust pump 260 for exhausting the processing chamber 250 of the housing 240 both initially and continuously thereafter to remove the carrier gas.

The carrier gas 600 supplied from the source 800 can be helium, which has been found to increase the glass temperature range and the pressure range that provide film characteristics such as deposition density and good bonding. Alternatively, the carrier gas can be another gas such as nitrogen, neon, argon or krypton, or combinations of these gases. It is also possible for the carrier gas to include an amount of a reactive gas such as oxygen that can advantageously affect growth properties of the material. A flow rate of 0.3 to 10 standard liters per minute of the carrier gas has been determined to be sufficient to provide the material flow to distributor assembly 300 for deposition on a substrate.

Figure 3:
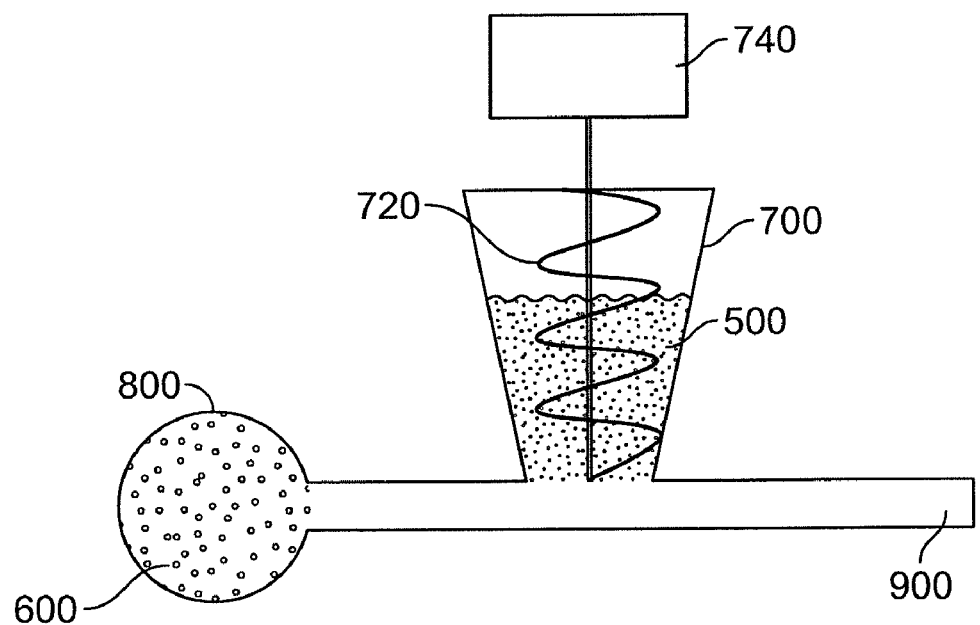
FIG. 3 is a drawing depicting an embodiment of a material supply.
Figure 4:
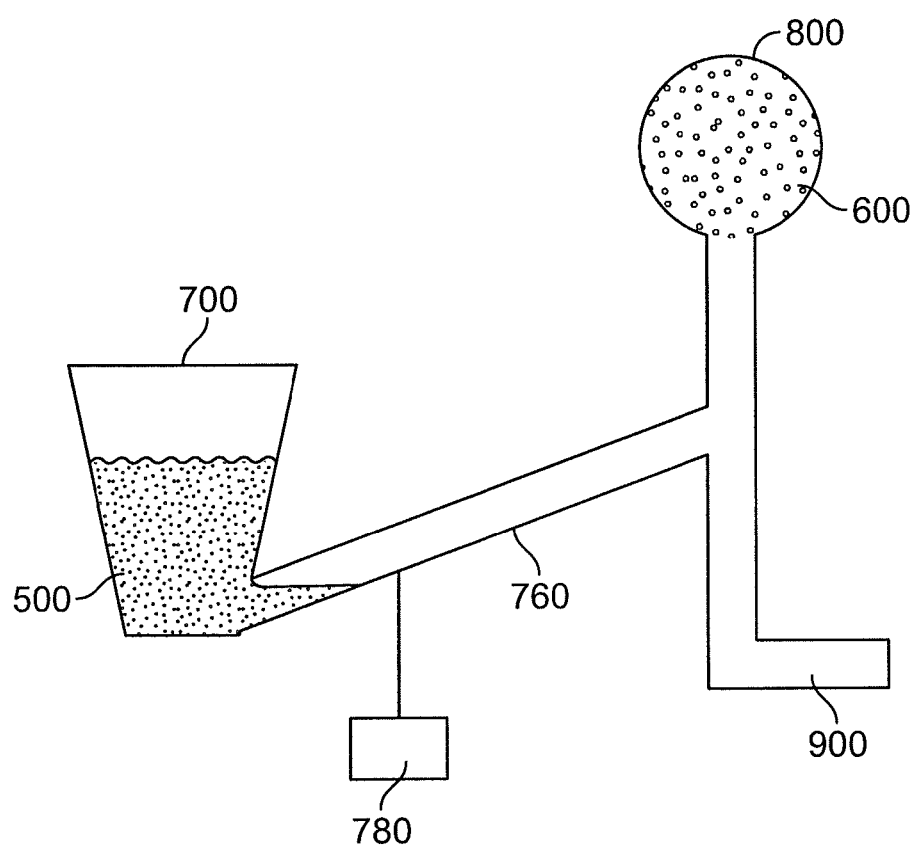
FIG. 4 is a drawing depicting an alternate embodiment of a material supply.

It should be recognized that multiple material supplies having multiple hopper and multiple carrier gas sources may introduce carrier gas and material into the distributor assembly. A single material supply is shown in FIG. 2 and subsequent figures for the sake of clarity. FIG. 3 and FIG. 4 depict alternate embodiments of a material supply which can be used. As shown in FIG. 3, hopper 700 containing powder 500 may include a rotary screw 720, which, when rotated by actuator 740 delivers powder 500 into feed tube 900, where it is introduced into carrier gas 600 delivered from carrier gas source 800. Alternatively, as shown in FIG. 4, a vibration-actuated material source is depicted, in which a vibration introduced by vibratory feeder 780 causes powder 500 to incrementally move from hopper 700 into inclined passage 760. In this manner, powder is introduced into feed tube 900, along with carrier gas 600 from carrier gas source 800.

Figure 5:
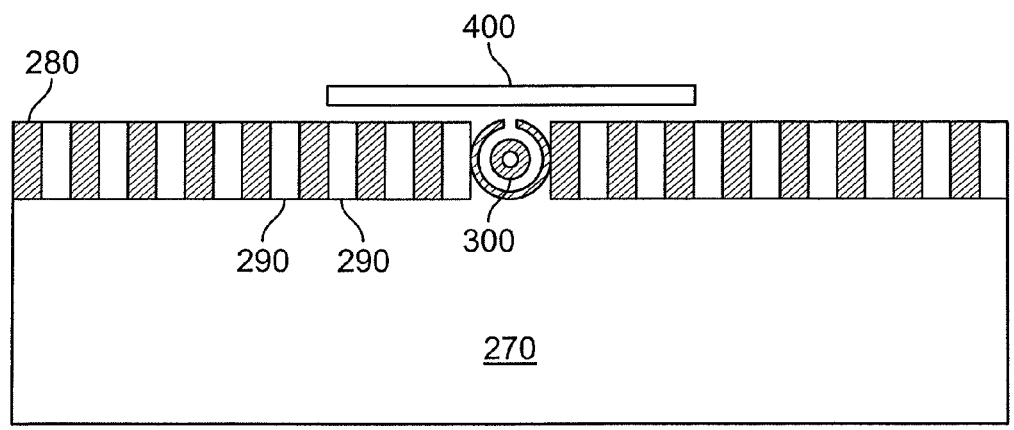
FIG. 5 is a drawing depicting an embodiment of a system for depositing a semiconductor on a downward-facing surface of a glass sheet substrate.

FIG. 5 represents an alternative embodiment of system 200 in which a semiconductor film may be deposited on a downward-facing surface of substrate 400. The alternate system depicted includes a refractory hearth 280 above a plenum 270 of heated pressurized gas. Holes 290 in hearth 280 provide for upward flow of the pressurized heated gas so as to support glass substrate 400 in a floating manner. As floating glass substrate 400 is conveyed along the length of hearth 280, the downward-facing surface passes proximate to distributor assembly 300, from which semiconductor vapor is directed toward and deposited as a film on substrate 400.

Figure 6:
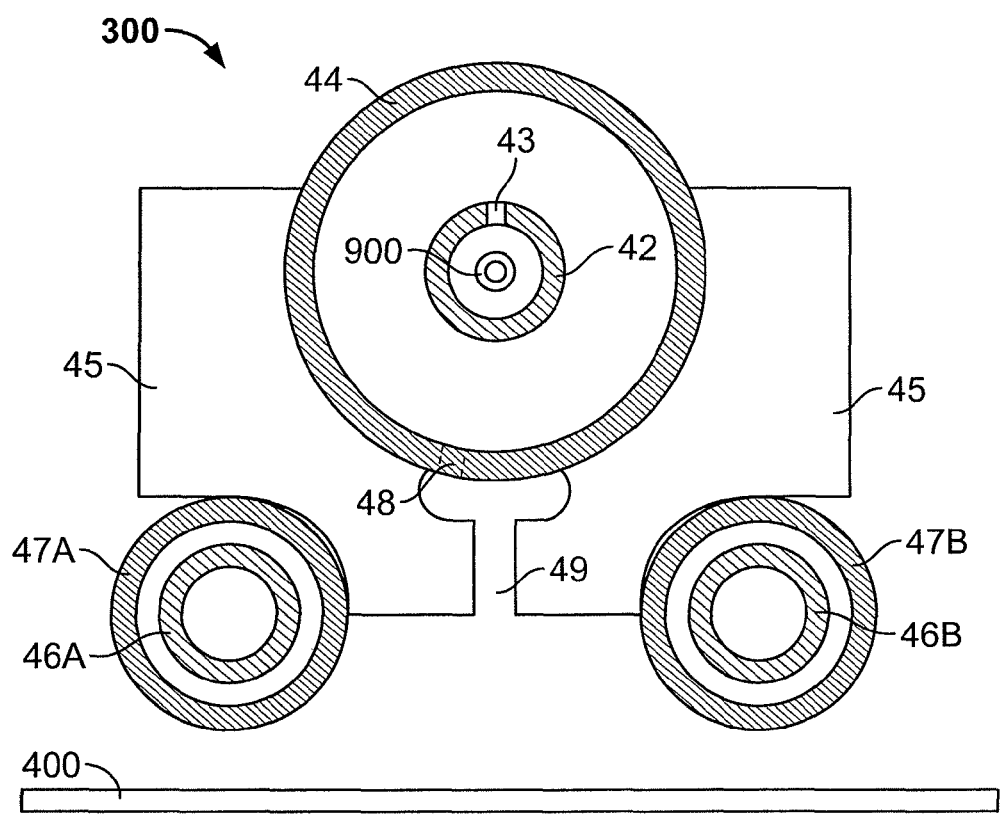
FIG. 6 is a drawing depicting an embodiment of a distributor assembly.

Various embodiments of distributor assembly 300 are described below. Referring to FIG. 6, one embodiment of distributor assembly 300 is described with reference to its internal components. As described above, a carrier gas and material are introduced into distributor assembly 300 through feed tube 900 which can be formed from mullite, and which can have an outer diameter of about 5 mm to about 15 mm (preferably about 10 mm), and an inner diameter of about 5 mm to about 10 mm (preferably about 6 mm). Carrier gas and material are first directed into the interior of a first chamber, heater tube 42, which can be impermeable and can have an outer diameter of about 15 mm to about 54 mm (preferably about 19 mm), and an inner diameter of about 10 mm to about 15 mm (preferably about 13 mm). Heater tube 42 can be formed from graphite or silicon carbide (SiC), and can be resistively heated by applying a current across heater tube 42. When the material introduced into the interior of heater tube 42 is a cadmium chalcogenide material, heater tube 42 can be heated to a temperature of about 500 degrees C. to about 1200 degrees C. to vaporize the cadmium chalcogenide. If heater tube 42 is formed from graphite, heater tube 42 can be heated to a temperature of about 1200 degrees to about 1500 degrees C. when the material is a cadmium chalcogenide. This higher temperature vaporizes cadmium chalcogenide material more quickly. Forming heater tube 42 from graphite allows higher temperatures to be utilized since it provides resistance against deterioration potentially caused by the vapor in this temperature range.

As new material and carrier gas are introduced into heater tube 42, the vapor and carrier gas are directed out of heater tube 42 through outlet 43, which can be a single hole, and which can have diameter of about 2 mm to about 20 mm (preferably about 3 mm), into a second chamber, distribution manifold 44. Outlet 43 can also represent a plurality of distribution holes. Distribution manifold 44 can be composed of graphite or mullite, or another suitable ceramic, and can have an outer diameter of about 75 mm to about 100 mm (preferably about 86 mm) and an inner diameter of about 50 mm to about 80 mm (preferably about 70 mm).

Distribution manifold 44 is positioned above glass substrate 400 by a cradle 45, which can be formed from graphite, such that the length of distribution manifold 44 covers at least a portion of the width of substrate 400 as substrate 400 is conveyed beneath distribution manifold 44. The vapor and carrier gas travel within and along the length of distribution manifold 44 until the vapor and carrier gas form a uniform vapor/carrier gas composition. Next, the uniform vapor/carrier gas composition is directed out of distribution manifold 44 through a plurality of distribution holes 48 aligned in a row along the length of distribution manifold 44. Distribution holes 48 can number about 20 to about 50 and can have a diameter of about 1 mm to about 5 mm (preferably about 3 mm). The number of distribution holes 48 included in distributor assembly 300 can be varied as required, and can be spaced from about 19 mm to about 25 mm apart. The uniform vapor/carrier gas composition is then directed into a nozzle 49 formed by graphite cradle 45, after which the vaporized semiconductor is deposited on underlying substrate 400, which can be a glass sheet substrate. Directing the uniform vapor/gas composition streams emitted from distribution holes 48 into a portion of cradle 45, as depicted in FIG. 6 disperses the uniform vapor/gas composition and further increases its uniformity of composition, pressure and velocity in preparation for deposition on underlying substrate 400.

As shown in FIG. 6, graphite cradle 45 is heated by adjacently positioned tubes 47A and 47B, which can be formed from mullite and which shroud secondary heater tubes 46A and 46B, respectively, which can be resistively heated silicon carbide (SiC) tubes, and which can have an outer diameter of about 25 mm to about 75 mm (preferably about 54 mm). As substrate 400 is conveyed by the orifice of nozzle 49 a film is formed on the surface of substrate 400, adjacent to nozzle. The proximity of substrate 400 to nozzle 49 increases the efficiency of depositing the film by reducing the amount of material wasted.

Figure 7:
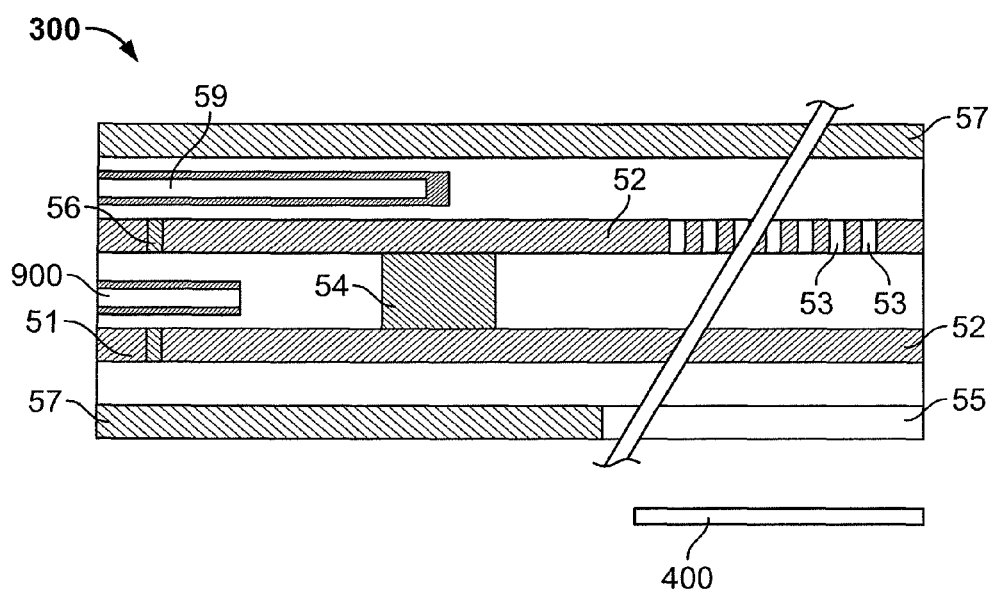
FIG. 7 is a drawing depicting an embodiment of a distributor assembly.

FIG. 7 depicts a cross section view taken along the length of a distributor assembly 300. A carrier gas and a powder are introduced through feed tube 900 into heater tube 52. Heater tube 52 can be resistively heated by applying current across the length of heater tube 52 and is preferably formed from substantially impermeable graphite or SiC. The powder and carrier gas are heated in heater tube 52, causing the powder to vaporize. The vapor and carrier gas are then directed through filter 54 provided in heater tube 52. Filter 54 can be formed from a material that is permeable to the carrier gas and vapor, but not to the powder, thereby ensuring that no powder is ultimately deposited on the substrate. Heater tube 52 may be joined by internal joints 56 to low-resistance electrified ends 51, which are not permeable.

After the vapor and carrier gas are directed through filter 54, the mixture is directed into a portion of heater tube 52 having a plurality of outlets 53, which are preferably holes drilled in a line on one side of heater tube 52. The vapor and carrier gas are then directed through outlets 53 into the interior of an outer tubular sheath 57 which shrouds heater tube 52. Outer tubular sheath 57 can be formed from mullite. During the passage through heater tube 52 and into and within outer tubular sheath 57, the irregular flow of the vapor and carrier gas results in continuous mixing and diffusion of the vapor and the carrier gas to provide a uniform vapor/carrier gas composition. As shown in FIG. 7, the interior of outer tubular sheath 57 can include a thermowell 59 for monitoring the temperature of distributor assembly 300.

The uniform vapor/carrier gas composition is directed within the interior of outer tubular sheath 57 and toward a slot 55, which is preferably located on the side of outer tubular sheath substantially opposite outlets 53 to provide a lengthy and indirect pathway for the vapor and carrier gas, thereby dispersing the streams of uniform vapor/carrier gas composition directed from outlets 53 and promoting maximum mixing and uniformity of gas composition, pressure and velocity. The uniform vapor/carrier gas composition is directed out of outer tubular sheath 57 through slot 55 and the film of material is deposited on underlying substrate 400.

It should be appreciated that FIG. 7 depicts a portion of distributor assembly 300 and an additional feed tube and internal filter may be provided at an opposite end of distributor assembly 300, which is not shown in FIG. 7.

Figure 8:
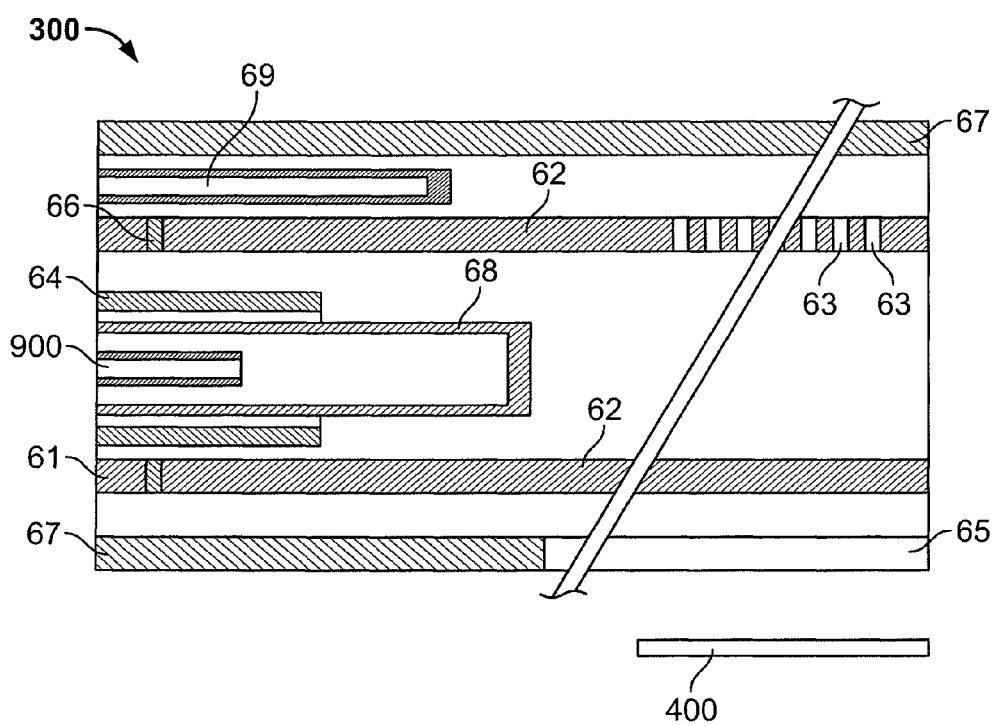
FIG. 8 is a drawing depicting an embodiment of a distributor assembly.

FIG. 8, like FIG. 7, depicts a cross section view taken along the length of a distributor assembly 300. According to this embodiment, a carrier gas and a powder are introduced through feed tube 900 into heater tube 62. Feed tube 900 can be formed from mullite or aluminum oxide and can have an outer diameter of about 5 mm to about 15 mm (preferably about 7 mm), and an inner diameter of about 3 mm to about 10 mm (preferably about 5 mm). Heater tube 62 can be resistively heated by applying a current across the length of heater tube 62 and can be formed from graphite or SiC. Heater tube 62 can have an outer diameter of about 25 mm to about 75 mm (preferably about 54 mm), and an inner diameter of about 20 mm to about 50 mm (preferably about 33 mm). The powder and carrier gas are heated in heater tube 62, causing the powder to vaporize.

In contrast to the embodiment described above in which the vapor and carrier gas were directed through an internal filter, in the embodiment described with reference to FIG. 8, after heating, the vapor and carrier gas are then directed through cantilevered internal filter 68 which is formed from SiC and is permeable to the vapor and the carrier gas. Internal filter 68 can have an outer diameter of about 10 mm to about 30 mm (preferably about 20 mm), and an inner diameter of about 5 mm to about 15 mm (preferably about 9 mm). The vapor and carrier gas are directed through cantilevered internal filter 68 into the interior of heater tube 62. Isolation sleeve 64 is provided to prevent electrical arcs between cantilevered internal filter 68 and heated sleeve 64, resulting in heater failure. Isolation sleeve 64 can be made from a non-conductive material such as mullite or aluminum oxide and can have an outer diameter of about 20 mm to about 40 mm (preferably about 32 mm), and an inner diameter of about 20 mm to about 30 mm (preferably about 25 mm). Heater tube 62 may be joined by internal joints 66 to low-resistance electrified ends 61.

The vapor and carrier gas are then directed through a plurality of outlets 63, which can be drilled holes formed in a line on one side of heater tube 62. Outlets 63 can have a diameter of about 2 mm to about 5 mm (preferably about 3 mm), and can number about 15 to about 40 along the length of heater tube 62 and can be spaced about 19 mm to about 25 mm apart. The vapor and carrier gas enter the interior of a outer tubular sheath 67, which shrouds heated tube 62. Outer tubular sheath 67 can be formed from mullite. During the passage through heater tube 62 and into and within outer tubular sheath 67, the irregular flow of the vapor and carrier gas results in continuous mixing and diffusion of the vapor components and carrier gas to form a uniform vapor/carrier gas composition. The interior of outer tubular sheath 67 can also include a thermowell 69, which can be formed from aluminum oxide and can have an outer diameter of about 5 mm to about 10 mm (preferably about 7 mm), for monitoring the temperature of distributor assembly 300.

The uniform vapor/carrier gas composition is directed within the interior of outer tubular sheath 67, dispersing the streams of vapor and carrier gas directed from outlets 63 and increasing the uniformity of composition, pressure and velocity of the vapor and carrier gas. The uniform vapor/carrier gas composition is directed and toward a slot 65, which can be located on a side of outer tubular sheath 67 substantially opposite outlets 63 to provide a lengthy and indirect path for the vapor and carrier gas, thereby promoting maximum mixing and uniformity of the vapor/carrier gas composition. The uniform vapor/carrier gas composition is directed out of outer tubular sheath 67 through slot 65 and is deposited on a surface of underlying substrate 400.

It should be appreciated that as with FIG. 7, FIG. 8 depicts a portion of distributor assembly 300 and an additional feed tube and cantilevered internal filter may be provided at an opposite end of distributor assembly 300, which is not shown in FIG. 8.

Figure 9A:
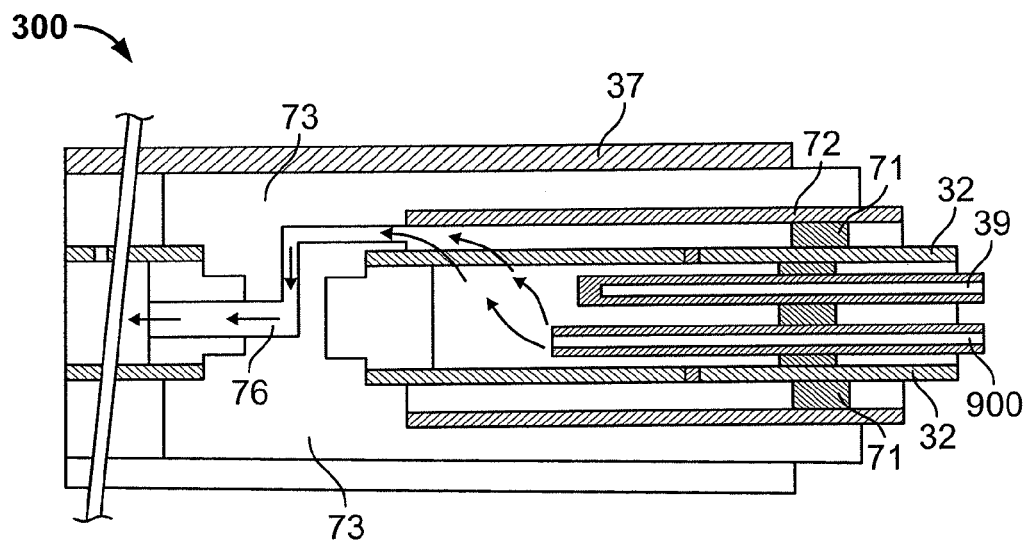
FIG. 9A is a drawing depicting an embodiment of a distributor assembly.
Figure 9B:
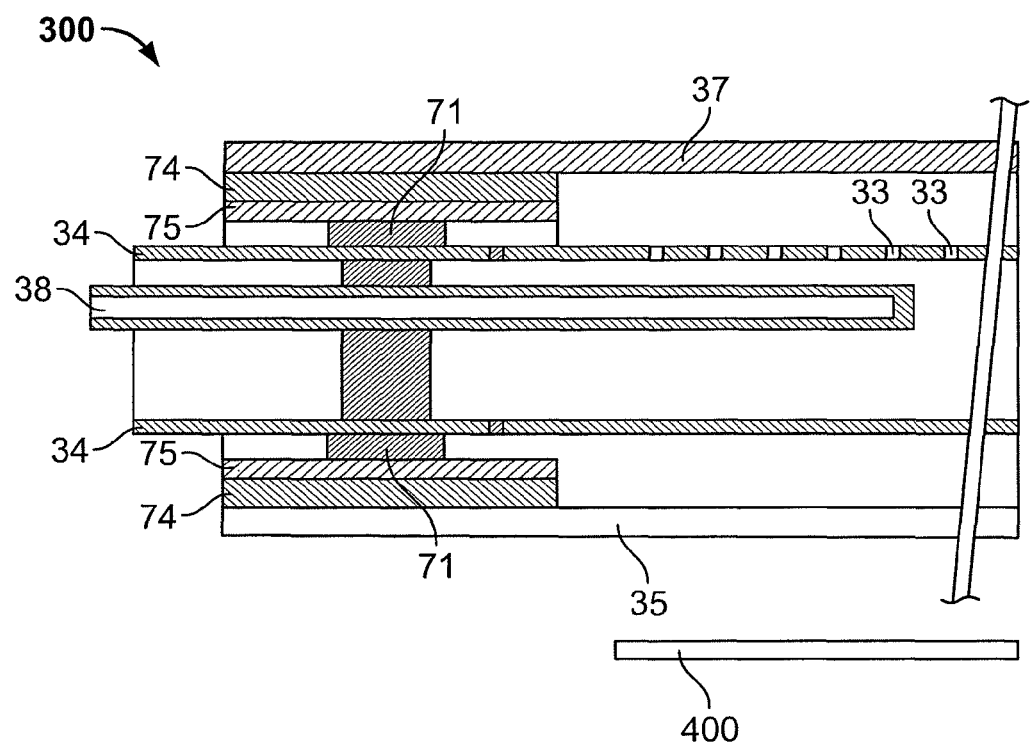
FIG. 9B is a drawing depicting a second view of a distributor assembly of FIG. 9A.

Referring now to FIG. 9A and FIG. 9B, an alternative embodiment of distributor assembly 300 is presented in cross-sectional view along the length of the distributor assembly 300. A powder and a carrier gas are introduced into a heated tube 32, which is heated resistively. The resistive electrical path is provided by tubular center electrode 73, which can be formed from graphite. Heated tube 32 is permeable and can be made from SiC. Also contained within the interior of heated tube 32 is thermowell 39 for monitoring the temperature of heated tube 32.

The heat provided from resistively heated tube 32 causes the powder to vaporize inside heated tube 32, after which the resulting vapor and carrier gas permeate the walls of heated tube 32 and are directed to the interior of surrounding sleeve 72, which can be composed of mullite. The powder that is not vaporized does not permeate the walls of heated tube 32. Surrounding sleeve 72 is oriented inside a larger-diameter outer tubular sheath 37, with portions of tubular center electrode 73 separating surrounding sleeve 72 from outer tubular sheath 37, which, like surrounding sleeve 72 can be made from mullite. The vapor and carrier gas are prevented from escaping the interior of surrounding sleeve 72 by a stopper sleeve 71, which can be made of ceramic tape packing. The vapor and carrier gas are directed into passageway 76 formed in tubular center electrode 73. As the vapor and carrier gas travel through distributor assembly 300, and passageway 76 in particular, the irregular flow pattern causes the vapor and carrier gas to mix and diffuse into a substantially uniform vapor/carrier gas composition.

Referring now to FIG. 9B, which depicts the opposite portion of distributor assembly 300 shown in FIG. 9A, the uniform vapor/carrier gas composition exits passageway 76 into the interior of a second heated tube 34, which may include a second thermowell 38. Second heated tube 34, like first heated tube 32, is oriented within larger-diameter outer tubular sheath 37. At the end of second heated tube 34 where the uniform vapor/carrier gas composition enters second heating tube 34 from passageway 76, the second heated tube 34 is isolated from outer tubular sheath 37 by tubular central electrode 73. At the opposite end of second heated tube 34, space is provided between second heated tube 34 and outer tubular sheath 37 by a tubular graphite spacing bushing 74, an electrically isolated mullite cylindrical sleeve 75, and ceramic tape packing 71 as required.

After the vapor/carrier gas uniform composition is directed into second heated tube 34, it travels within and along second heated tube 34, continuously remixing the vapor/carrier gas composition. The uniform vapor/carrier gas composition is then directed out of second heated tube 34 into the interior of outer tubular sheath 37 through a plurality of outlets 33, which can be holes drilled in a line along a portion of the length of one side of second heated tube 34. As with previous embodiments, after traveling through outlets 33, the vapor/carrier gas composition is directed within outer tubular sheath 37, dispersing the streams of vapor/carrier gas composition directed through outlets 33 and further promoting vapor/carrier gas uniformity of composition, pressure and velocity. The vapor/carrier gas composition is finally directed toward slot 35, which is preferably provided on a side of outer tubular sheath 37 substantially opposite outlets 33 to maximize the path length of the vapor/carrier gas composition and resulting uniformity thereof. Finally, the substantially uniform vapor/carrier gas composition is directed out slot 35 (which can be provided along the entire length of outer tubular sheath 37) toward underlying substrate 400 so that a film may be deposited thereon.

Figure 10A:
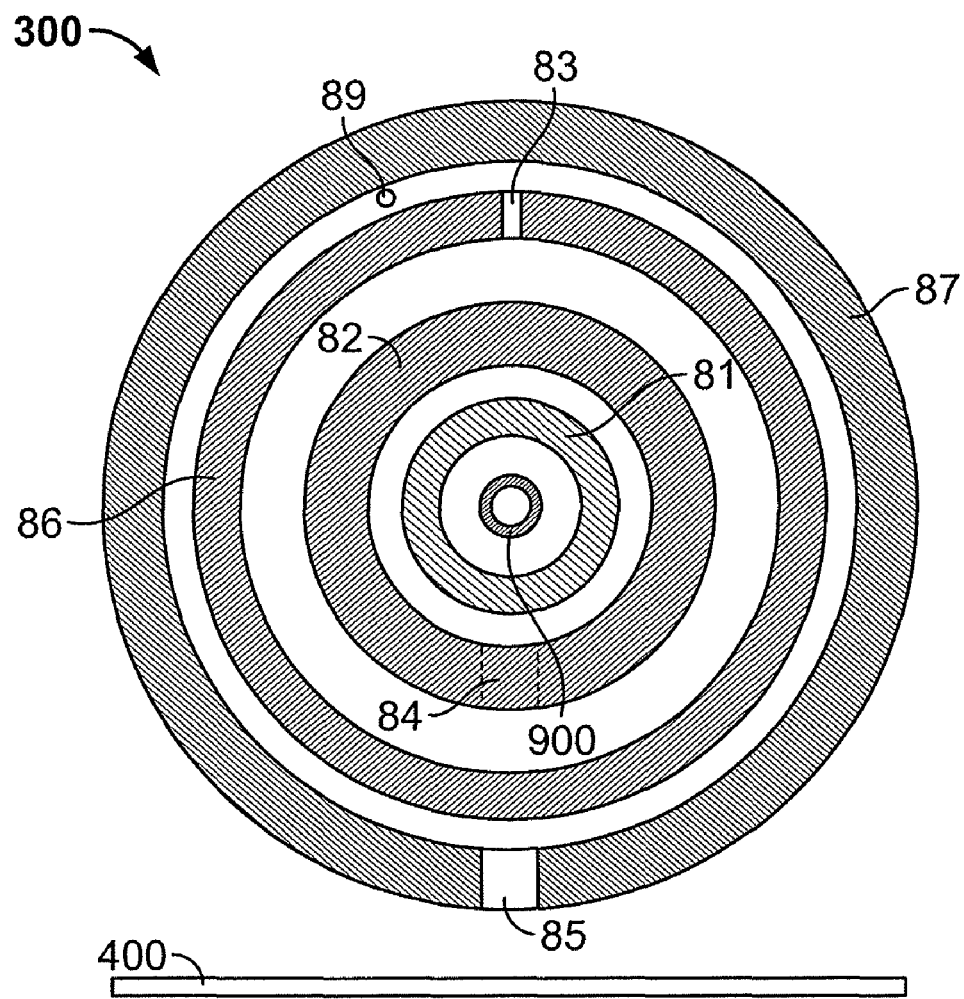
FIG. 10A is a drawing depicting a first view of another embodiment of a distributor assembly.
Figure 10B:
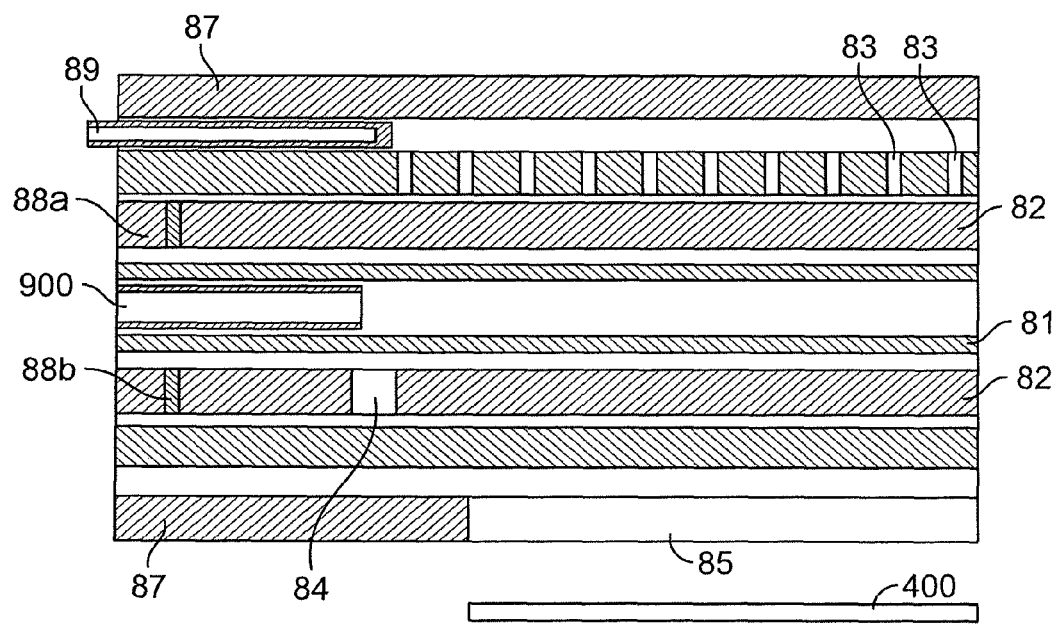
FIG. 10B is a drawing depicting a second view of a distributor assembly of FIG. 10A.

Referring now to FIG. 10A and FIG. 10B, an alternate embodiment of distributor assembly 300 is depicted. A powder and carrier gas are introduced into distributor assembly 300 through feed tube 900. The powder and carrier gas are first directed into a filter tube 81 positioned inside heater tube 82. Heater tube 82 heats filter tube 81 to a temperature sufficient to vaporize the powder inside filter tube 81. Filter tube 81 can also be resistively heated, and can have an outer diameter of about 20 mm to about 40 mm (preferably about 30 mm), and an inner diameter of about 10 mm to about 20 mm (preferably about 16 mm). Heated tube 81 is permeable to the vapor, so the vapor and carrier gas permeate filter tube 81 and are directed into heater tube 82. Filter tube 81 can be formed from SiC.

After the vapor and carrier gas permeate through filter tube 81 and into heater tube 82, the vapor and carrier gas travel within heater tube 82, which causes the vapor and carrier gas to mix. Heater tube 82 can be resistively heated and can be formed from impermeable SiC, such as the Kanthal Globar type CRL element available from Sandvik Materials Technology (http://www.smt.sandvik.com). Heater tube 82 can have an outer diameter of about 40 mm to about 55 mm (preferably about 50 mm), an inner diameter of about 35 mm to about 45 mm (preferably about 45 mm), and may be attached to low-resistance ends 88*a* of distributor assembly 300 by internal joints 88*b*.

As new vapor and carrier gas permeate into heater tube 82 from filter tube 81, the mixed vapor and carrier gas are directed out of heater tube 82 through outlet 84, which can be a single drilled hole located near one end of heater tube 82, and which can have a diameter of about 10 mm to about 15 mm (preferably about 13 mm). The vapor and carrier gas are directed through outlet 84, which causes the vapor and carrier gas to continue to mix while entering the interior of manifold 86, which can be formed from graphite, and which can have an outer diameter of about 75 mm to about 100 mm (preferably about 86 mm), and an inner diameter of about 60 mm to about 80 mm (preferably about 70 mm).

The flow of the vapor and carrier gas within manifold 86 causes the vapor and carrier gas to continue to mix and form a uniform vapor/carrier gas composition. The vapor and carrier gas are directed from drilled hole 84 on one side of heater tube 82 around heating tube 82 inside manifold 86 to a plurality of distribution holes 83 positioned in a line along the length of manifold 86 on a side of manifold 86 substantially opposite the side of heater tube 82 where drilled hole 84 is located. A thermowell 89 is also provided proximate to heater tube 82 in order to monitor the temperature of distributor assembly 300.

The uniform vapor/carrier gas composition is directed out of manifold 86 through distribution holes 83 into the interior of outer tubular sheath 87, which can be formed from mullite. Distribution holes 83 can have a diameter of about 1 mm to about 5 mm (preferably about 3 mm). The uniform vapor/carrier gas composition mixture is directed from distribution holes 83 and between the interior surface of outer tubular sheath 87 and the exterior of manifold 86 to disperse the streams of uniform vapor/carrier gas composition directed from distribution holes 83 and further increase the vapor/carrier gas uniformity of composition, pressure, and velocity. This flow continues to mix the vapor and the carrier gas, maintaining the uniform vapor/carrier gas composition, which is directed to slot 85 running along a portion of the length of outer tubular sheath 87, and located on a side of outer tubular sheath 87 substantially opposite the position on manifold 86 where distribution holes 83 are located. Outer tubular sheath 87 can be formed from mullite, and can have an outer diameter of about 80 mm to about 150 mm (preferably about 116 mm), and an inner diameter of about 60 mm to about 130 mm (preferably about 104 mm). After it is directed out distributor assembly 300 via slot 85, the vapor is deposited as a film on underlying substrate 400, which is conveyed past distributor assembly 300.

As with earlier embodiments, it should be noted that FIG. 10B depicts a portion of distributor assembly 300 and an additional feed tube and material source may be provided at an opposite end of distributor assembly 300, which is not shown in FIG. 10B.

Figure 11A:
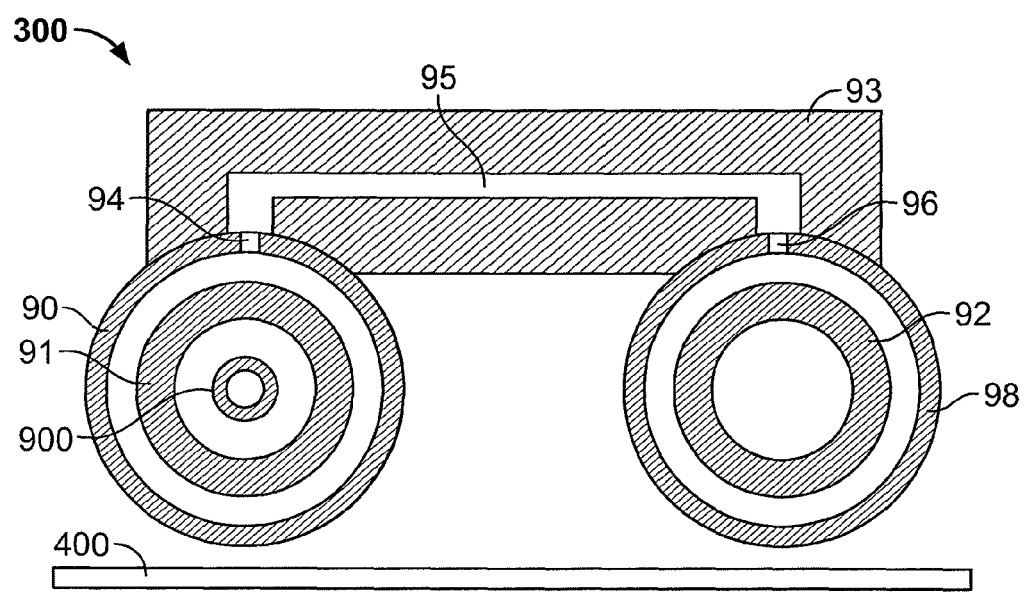
FIG. 11A is a drawing depicting a first view of an embodiment of a distributor assembly.
Figure 11B:
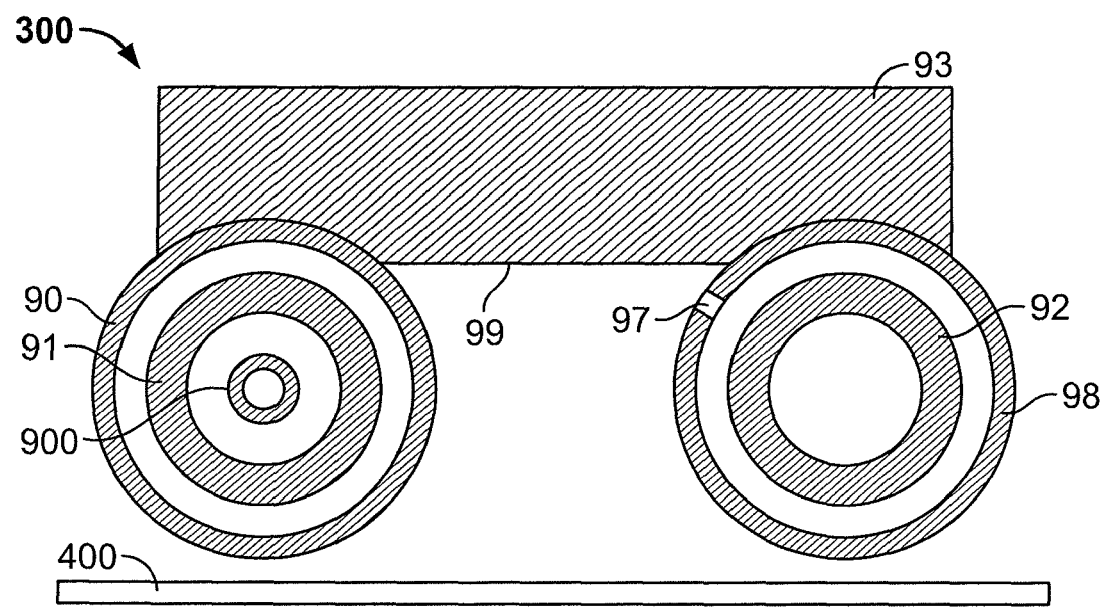
FIG. 11B is a drawing depicting a second view of an embodiment of a distributor assembly of FIG. 11A.

Referring now to FIG. 11A and FIG. 11B, an alternate embodiment of a distributor assembly 300 is depicted. A powder and a carrier gas are directed into the interior of first heater tube 91 via feed tube 900. First heater tube 91 is resistively heated to a temperature sufficient to vaporize the powder and is permeable to the resulting vapor and the carrier gas, but impermeable to the powder. Consequently, any powder that is not vaporized is unable to pass from the interior of first heater tube 91. First heater tube 91 can be formed from SiC.

After the powder is vaporized to form a vapor, the vapor and carrier gas permeate the walls of first heater tube 91 and are directed to the space between first heater tube 91 and first tubular sheath 90, which can be formed from mullite, graphite, or cast ceramic. Passage within first tubular sheath 90 causes the vapor and carrier gas to mix to form a uniform vapor/carrier gas composition. The uniform vapor/carrier composition is directed through first outlet 94. First outlet 94 can be a single drilled hole and the vapor and carrier gas are further remixed as they pass through first outlet 94.

As shown in FIG. 11A, the uniform vapor/carrier gas composition directed through first outlet 94 enters passageway 95, which leads to a second tubular sheath 98. Passageway 95 may be formed in a block 93, which in turn physically connects the interiors of first tubular sheath 90 and second tubular sheath 98, and which can be formed from mullite, graphite, or cast ceramic. The uniform vapor/carrier gas composition is directed through passageway 95 are then directed through inlet 96, which can be a single drilled hole formed in second tubular sheath 98, which can be formed from mullite.

Referring now to FIG. 11B, the uniform vapor/carrier gas composition is directed through second tubular sheath 98, which remixes the vapor and carrier gas, maintaining the uniform vapor/carrier gas composition. The uniform vapor/carrier gas composition is then directed out a plurality of terminal outlets 97, which can be drilled holes provided along at least a portion of the length of the second tubular sheath 98. The uniform vapor/carrier gas composition can be directed toward a vapor cap 99, which may include a downward-facing surface of block 93 and which, along with the first tubular sheaths 90 and second tubular sheath 98, defines a space (preferably about 1 to about 2 cm wide) and spreads streams of the uniform vapor/carrier gas composition emitted from terminal outlets 97 and further increases the uniformity of the vapor/carrier gas with respect to composition, pressure, and velocity. The uniform vapor/carrier gas composition is consequently directed away from distributor assembly 300, towards underlying substrate onto which the vapor is deposited as a film.

Figure 12:
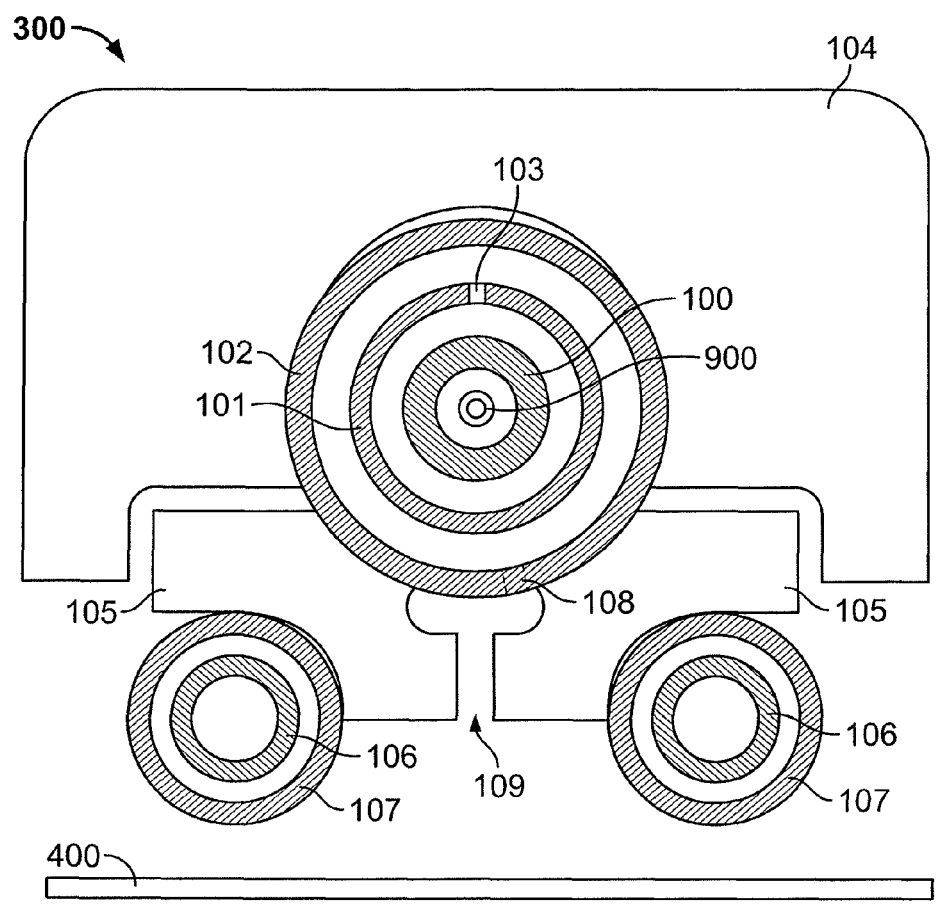
FIG. 12 is a drawing depicting an embodiment of a distributor assembly.

Referring now to FIG. 12, an alternate embodiment of a distributor assembly 300 is depicted. A powder and carrier gas are introduced into the interior of heater tube 100. Heater tube 100 is heated to a temperature sufficient to vaporize the powder as it travels within and along the length of heater tube 100. Heater tube 100 can be resistively heated, and can be formed from SiC. Heater tube 100 is permeable to the vapor and carrier gas, but not to the powder. As the powder is vaporized in heater tube 100, it begins to form a uniform vapor/carrier gas composition with the carrier gas.

The vapor and carrier gas permeate through heater tube 100 into tubular sheath 101, which surrounds heater tube 100 and can be formed from mullite. The vapor and carrier gas are directed within tubular sheath 101, which causes the vapor and carrier gas to continually mix. The vapor and carrier gas are then directed toward outlet 103, which can be a single drilled hole formed in tubular sheath 101. As the vapor and carrier gas are directed through outlet 103, they are remixed even further, contributing to an increasingly uniform vapor/carrier gas composition.

The mixed vapor and carrier gas travel through outlet 103 into the interior of distribution manifold 102, which, like tubular sheath 101, can be formed from mullite or graphite. Distribution manifold 102 may be encased or surrounded by an insulation such as a fiber blanket insulation 104 for retaining heat generated by permeable heated tube 100, thereby reducing the energy required to maintain the temperature required to vaporize the powder. Distribution manifold 102 can be supported by a cradle 105, which can be formed from graphite. Cradle 105 is heated by proximate heater tubes 106, which can be formed from SiC and resistively heated, and located inside proximate tubular sheaths 107, which can be formed from mullite and which conduct heat generated by proximate heater tubes 106 to the adjacent cradle 105.

After the uniform vapor/carrier gas composition is directed through outlet 103 in tubular sheath 101, the vapor and carrier gas continue to mix as they are directed through the space between the interior wall of distribution manifold 102 and the exterior of tubular sheath 101. The uniform vapor/carrier gas composition is directed to a plurality of distribution holes 108 located at a position in distribution manifold 102 substantially opposite the position on tubular sheath 101 at which outlet 103 is located. The plurality of distribution holes 108 can be aligned along at least a portion of the length of distribution manifold 102. The uniform vapor/carrier gas composition is directed through distribution holes 108 toward a portion of graphite cradle 105, dispersing streams of uniform vapor/carrier gas composition directed through distribution holes 108 and further increasing the uniformity of the vapor/carrier gas with respect to composition, pressure, and velocity. The uniform vapor/carrier gas composition is directed into a nozzle 109 formed by graphite cradle 105 and is then deposited as a film on underlying substrate 400.

Figure 13:
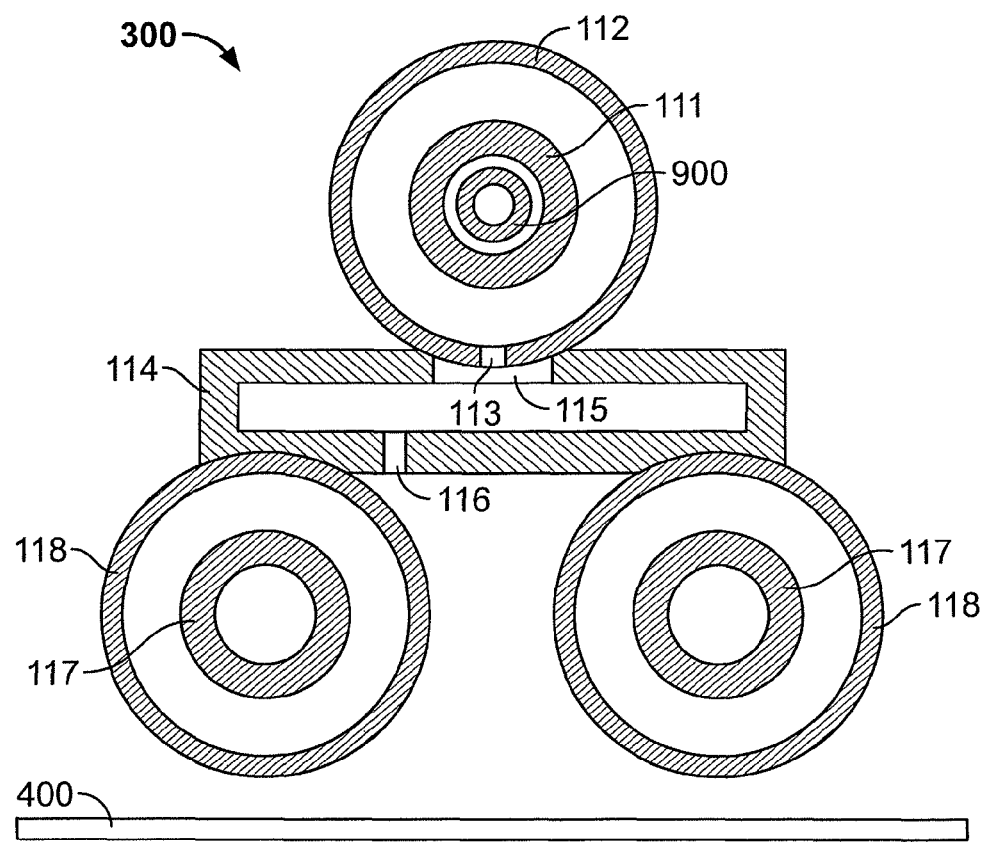
FIG. 13 is a drawing depicting an embodiment of a distributor assembly.

Referring now to FIG. 13, an alternate embodiment of a distributor assembly 300 is depicted. A powder and a carrier gas are introduced into the interior of heater tube 111. Heater tube 111 is heated to temperature sufficient to vaporize the powder as it travels within and along the length of permeable heated tube 111. Heater tube 111 can be resistively heated, and can be formed from SiC. Heater tube 111 is permeable to the vapor and carrier gas, but not to the powder.

The vapor and carrier gas permeate through permeable heater tube 111 into outer tubular sheath 112, which surrounds permeable heater tube 111 and can be formed from mullite. The forming uniform vapor/carrier gas composition is directed within outer tubular sheath 112, which causes the vapor and carrier gas to continually mix. The uniform vapor/carrier gas composition is then directed toward outlet 113, which can be a single drilled hole formed in outer tubular sheath 112. As the semiconductor vapor and carrier gas are directed through outlet 113, they are remixed even further, contributing to an increasingly uniform vapor/carrier gas composition.

The uniform vapor/carrier gas composition is directed through outlet 113 into the interior of manifold 114, which includes a passageway 115 connecting the interior of manifold 114 with outlet 113 formed in outer tubular sheath 112.

Manifold 114 can be adjacent to proximate heater tubes 117, which can be formed from SiC and resistively heated, and located inside proximate tubular sheaths 118, which can be formed from mullite and which conduct heat generated by proximate heater tubes 117 to the adjacent manifold 114. As the vapor and carrier gas travel within manifold 114, they continue to remix, maintaining a uniform vapor/carrier gas composition.

As new vapor and carrier gas are introduced into the interior of manifold 114 through passageway 115, the uniform vapor/carrier gas composition is directed out of manifold 114 through a plurality of distribution holes 116, which can be arranged in a line parallel to the length of one of the tubular mullite sheaths 118, and is directed such that the flow of the uniform vapor/carrier gas composition is interrupted by a proximate tubular sheath 118, which disperses the streams of uniform vapor/carrier gas composition directed from distribution holes 116 and further increases the uniformity of the composition, pressure, and velocity of the vapor/carrier gas. The uniform vapor/carrier gas composition is then directed between both proximate tubular sheaths 118 and towards an underlying substrate 400, on which a resulting film is deposited.

Figure 14:
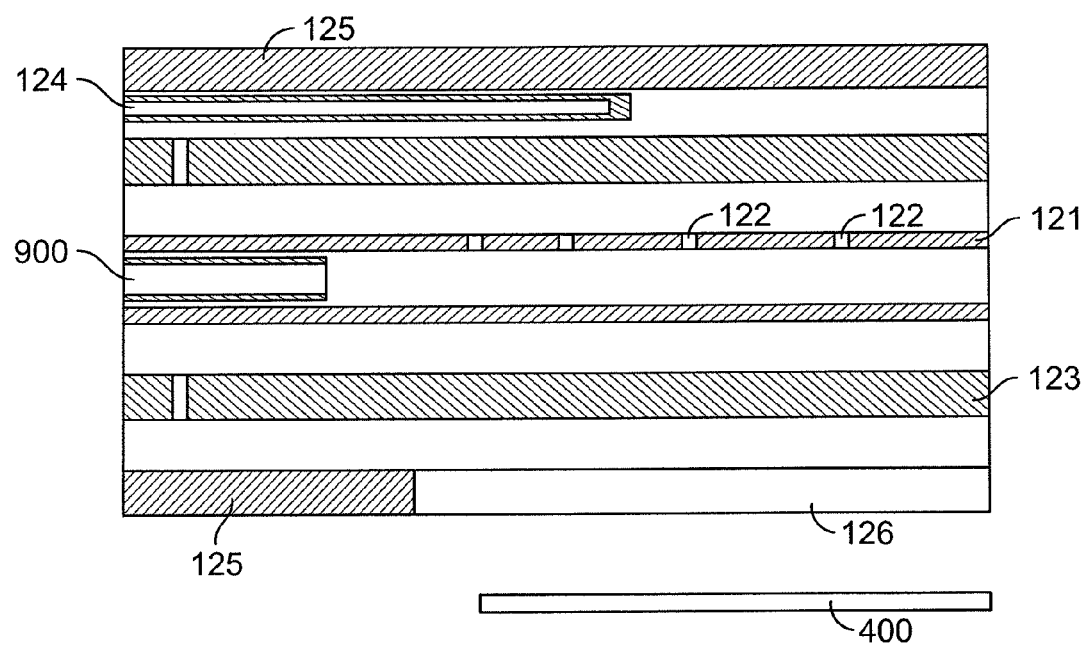
FIG. 14 is a drawing depicting an embodiment of a distributor assembly.

Referring now to FIG. 14, an alternate embodiment of a distributor assembly 300 is depicted. A powder and a carrier gas are introduced via feed tube 900 into inner distributor manifold 121. Inner distributor manifold 121 can be formed from SiC and can be impermeable, such as the Kanthal Globar type CRL element available from Sandvik Materials Technology (http://www.smt.sandvik.com). Inner distributor manifold 121 is surrounded by a permeable heater tube 123, which can be formed from SiC, and which can be resistively heated to a temperature sufficient to vaporize the powder. Thermowell 124 is provided proximate to permeable heater tube 123 to allow for monitoring and manipulation of the temperature of permeable heater tube 123.

Since permeable heater tube 123 surrounds inner distributor manifold 121, it heats the inner distributor manifold 121 (which itself can also be resistively heated) and begins to vaporize the powder while the powder and carrier gas travel within inner distributor manifold 121. The powder being vaporized and carrier gas are then directed through distributor holes 122, which can be drilled in a line along at least part of the length of inner distributor manifold 121. Powder, vaporized powder, and carrier gas are directed into the interior of permeable heater tube 123, dispersing the streams of uniform vapor/carrier gas composition directed from distributor holes 122 and further increasing the uniformity of the vapor/carrier gas with respect to composition, pressure, and velocity. As the newly formed vapor and carrier gas are directed into and within permeable heater tube 123, they continue to mix to form a substantially uniform vapor/carrier gas composition.

The uniform vapor/carrier gas composition then permeates the walls of permeable heater tube 123 into the interior of outer tubular sheath 125, which can be formed from mullite. Segregation that might otherwise be expected when directing the vapor and carrier gas of disparate molecular weight is insignificant due to the spacing of distributor holes 122. Within the interior of outer tubular sheath 125, the vapor and carrier gas continue to remix to maintain a uniform vapor/carrier gas composition. The uniform vapor/carrier gas composition is directed through the interior of outer tubular sheath 125 and through slot 126, which is provided along a length of outer tubular sheath 125 substantially opposite the side of inner distribution manifold 121 where distribution holes 122 are located. The uniform vapor/carrier gas composition is directed out of distributor assembly 300 and toward substrate 400, where the vapor is deposited as a substantially uniform film.

As with earlier embodiments, it should be noted that FIG. 14 depicts a portion of distributor assembly 300 and an additional feed tube and material source may be provided at an opposite end of distributor assembly 300, which is not shown in FIG. 14.

Figure 15A:
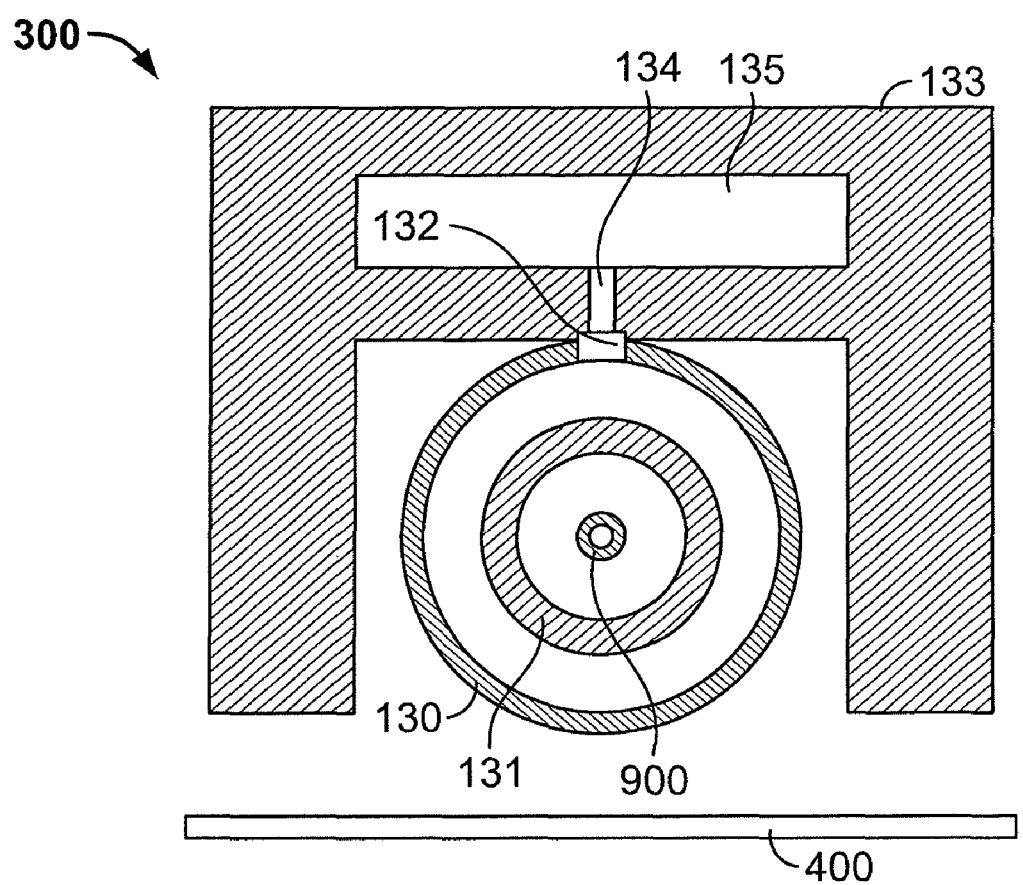
FIG. 15A is a drawing depicting a first view of an embodiment of a distributor assembly.
Figure 15B:
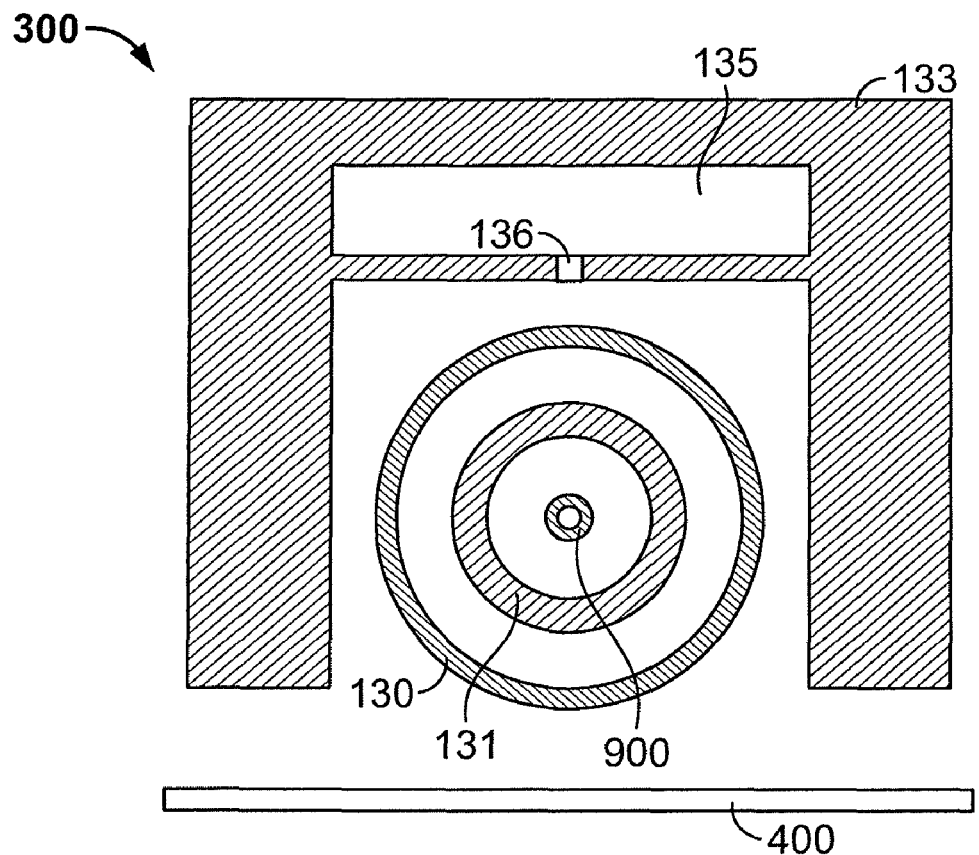
FIG. 15B is a drawing depicting a second view of an embodiment of a distributor assembly of FIG. 15A.

Referring now to FIG. 15A and FIG. 15B, an alternate embodiment of a distributor assembly 300 is depicted. A powder and a carrier gas are directed into the interior of heater tube 131 via feed tube 900, which can be formed from mullite, and which can have an outer diameter of about 5 mm to about 15 mm (preferably about 10 mm), and an inner diameter of about 5 mm to about 10 mm (preferably about 6 mm). Heater tube 131 is resistively heated to a temperature sufficient to vaporize the powder and is permeable to the resulting vapor and the carrier gas, but impermeable to the powder. Consequently, any powder that is not vaporized is unable to pass from the interior of heater tube 131. Heater tube 131 can be formed from SiC, and can have an outer diameter of about 30 to about 70 mm (preferably about 54 mm), and an inner diameter of about 25 mm to about 50 mm (preferably about 33 mm).

After the powder is vaporized to form a vapor, the vapor and carrier gas permeate the walls of heater tube 131 and are directed to the space between heater tube 131 and tubular sheath 130, which can be formed from graphite, mullite, or another suitable ceramic, and which has an outer diameter of about 60 mm to about 120 mm (preferably about 85 mm), and an inner diameter of about 50 mm to about 100 mm (preferably about 75 mm). Passage within tubular sheath 130 causes the vapor and carrier gas to mix to form a uniform vapor/carrier gas composition. The uniform vapor/carrier composition is directed through outlet 132 formed in tubular sheath 130. Outlet 132 can be a single drilled hole with a diameter of about 5 mm to about 20 mm (preferably about 13 mm) and the vapor and carrier gas are further remixed as they pass through outlet 132.

As shown in FIG. 15A, the uniform vapor/carrier gas composition directed through outlet 132 is then directed through hole 134 with a diameter of about 5 mm to about 20 mm (preferably about 13 mm) and into passageway 135, formed in block 133, which can be made of graphite, or mullite, or another suitable ceramic. The uniform vapor/carrier gas composition is directed through passageway 135.

Referring now to FIG. 15B, the uniform vapor/carrier gas composition directed through passageway 135 is directed out a plurality of distribution holes 136, which is formed in block 133 and which can be colinear to hole 134 along the length of block 133. Distribution holes 136 can be drilled, can have a diameter of about 1 mm to about 5 mm (preferably about 3 mm), and can number from about 10 to about 50 along the length of block 133, about 10 mm to about 25 mm (preferably about 19 mm) apart. The uniform vapor/carrier gas composition can be directed through distribution holes 136 toward a portion of tubular sheath 130, which disperses streams of uniform vapor/carrier gas composition directed from distribution holes 136 and further increases the uniformity of the vapor/carrier gas with respect to composition, pressure, and velocity. The uniform vapor/carrier gas composition is directed through a space formed by the outside of tubular sheath 130 and the interior of walls of block 133 towards underlying substrate onto which the vapor is deposited as a film.

The embodiments described above are offered by way of illustration and example. It should be understood that the examples provided above may be altered in certain respects and still remain within the scope of the claims. For example, the component dimensions described above are suitable for use with substrates up to 60 cm wide; adjustments can be made when using substrates of different sizes. It should be appreciated that, while the invention has been described with reference to the above preferred embodiments, other embodiments are within the scope of the claims.

What is claimed is:

1. A distributor assembly comprising:
   a first chamber for receiving a solid material and carrier gas and comprising one or more first chamber walls which are permeable to a vapor and the carrier gas but impermeable to the solid material;
   a heating element associated with the first chamber for vaporizing at least a portion of the solid material;
   a second chamber for receiving the vapor and the carrier gas from the first chamber and for providing a material flow sufficiently indirect to mix the vapor and the carrier gas into a substantially uniform vapor/carrier gas composition;
   a third chamber for receiving the vapor and the carrier gas from the second chamber including a third chamber inlet located proximate to an outlet of the second chamber; and
   a third chamber outlet for providing the uniform vapor/carrier gas composition for deposition on a surface of a substrate, wherein the third chamber outlet is offset from the third chamber inlet such that the flow direction of the vapor/carrier gas must change while flowing from the third chamber inlet to the third chamber outlet.

2. The distributor assembly of claim 1, wherein the first chamber and the second chamber are tubular, and the first tubular chamber is disposed within the second tubular chamber such that the second tubular chamber sheaths the first tubular chamber.

3. The distributor assembly of claim 1, wherein the one or more first chamber walls comprise the heating element, which is heated by resistive heating.

4. The distributor assembly of claim 1, wherein the heating element is capable of maintaining the first chamber at a temperature of at least 500 degrees C.

5. The distributor assembly of claim 4, wherein the heating element is capable of maintaining the first chamber at a temperature of at least 700 degrees C.

6. The distributor assembly of claim 1, wherein the second chamber comprises at least one distribution hole.

7. The distributor assembly of claim 1, wherein the second chamber comprises walls that are substantially impermeable to the vapor and the carrier gas.

8. The distributor assembly of claim 2, wherein the third chamber is tubular and forms a sheath around the second chamber.

9. The distributor assembly of claim 1, wherein the third chamber is formed in a block, and comprises:
   a passageway within the block connecting the third chamber inlet and the third chamber outlet.

10. The distributor assembly of claim 9, wherein the second chamber has an external surface, and the second chamber external surface and the third chamber outlet are configured such that the vapor/carrier gas is disbursed by the external surface of the second chamber after flowing from the third chamber outlet for deposition on the substrate.

11. The distributor assembly of claim 10, wherein the third chamber outlet comprises between about 10 to about 50 distribution holes.

12. The distributor assembly of claim 9, wherein the second chamber has an external surface and the block is at least partially surrounding the second chamber and configured to define a flow path between the block and the external surface of the second chamber and proximate to the third chamber outlet such that the flow direction of the vapor/carrier gas must change while flowing through the flow path for deposition on the surface of the substrate.

13. A system for depositing a film on a substrate comprising:
   a material source connected to a distributor assembly for introducing a solid material and carrier gas into the distributor assembly, wherein the distributor assembly comprises:
   a first chamber for receiving the solid material and the carrier gas and comprising one or more first chamber walls which are permeable to a vapor and the carrier gas;
   a heating element associated with the first chamber for providing a temperature high enough that at least a portion of the solid material vaporizes into a vapor;
   a second chamber for receiving the vapor and the carrier gas from the first chamber and for providing a material flow sufficiently indirect to mix the vapor and the carrier gas into a substantially uniform vapor/carrier gas composition;
   a third chamber for receiving the vapor and the carrier gas from the second chamber including a third chamber inlet located proximate to an outlet of the second chamber;
   a third chamber outlet for providing the uniform vapor/carrier gas composition for deposition on a surface of a substrate, wherein the third chamber outlet is offset from the third chamber inlet such that the flow direction of the vapor/carrier gas must change while flowing from the third chamber inlet to the third chamber outlet; and
   a conveyor for transporting the substrate proximate to the distributor assembly such that the vapor may be deposited from the third chamber on the substrate as a film.

14. The system of claim 13, wherein the first chamber and the second chamber are tubular, and the first tubular chamber is disposed within the second tubular chamber such that the second tubular chamber sheaths the first tubular chamber.

15. The system of claim 13, wherein the one or more first chamber walls comprise the heating element and are heated by resistive heating.

16. The system of claim 13, wherein the heating element is capable of maintaining the first chamber at a temperature of at least 500 degrees C.

17. The system of claim 16, wherein the heating element is capable of maintaining the first chamber at a temperature of at least 700 degrees C.

18. The system of claim 13, wherein the second chamber comprises one or more distribution holes.

19. The system of claim 13, wherein the third chamber is formed in a block, and comprises:
   a passageway within the block connecting the third chamber inlet and the third chamber outlet.

20. The system of claim 14, wherein the third chamber is tubular and forms a sheath around the second chamber.

21. The system of claim 19, wherein the second chamber has an external surface, and the second chamber external surface and the third chamber outlet are configured such that the vapor/carrier gas is disbursed by the external surface of the second chamber after flowing from the third chamber outlet for deposition on the substrate.

22. The system of claim 21, wherein the third chamber outlet comprises between about 10 to about 50 distribution holes.

23. The system of claim 19, wherein the second chamber has an external surface and the block is at least partially surrounding the second chamber and configured to define a flow path between the block and the external surface of the second chamber and proximate to the third chamber outlet such that the flow direction of the vapor/carrier gas must change while flowing through the flow path for deposition on the surface of the substrate.

* * * * *